(12) United States Patent
Tian et al.

(10) Patent No.: US 11,378,850 B2
(45) Date of Patent: Jul. 5, 2022

(54) SUBSTRATE ASSEMBLY, DISPLAY PANEL AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Jian Tian, Beijing (CN); Chunjian Liu, Beijing (CN); Qitao Zheng, Beijing (CN); Long He, Beijing (CN); Zouming Xu, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 500 days.

(21) Appl. No.: 16/505,143

(22) Filed: Jul. 8, 2019

(65) Prior Publication Data

US 2020/0015355 A1   Jan. 9, 2020

(30) Foreign Application Priority Data

Jul. 6, 2018 (CN) .......................... 201810738967.8

(51) Int. Cl.
| | |
|---|---|
| *G02F 1/1345* | (2006.01) |
| *G06F 3/041* | (2006.01) |
| *H01L 27/32* | (2006.01) |
| *H01R 12/79* | (2011.01) |
| *H05K 1/02* | (2006.01) |
| *H05K 1/14* | (2006.01) |

(52) U.S. Cl.
CPC ...... *G02F 1/13452* (2013.01); *G02F 1/13458* (2013.01); *G06F 3/041* (2013.01); *H01L 27/323* (2013.01); *H01L 27/3276* (2013.01); *H01R 12/79* (2013.01); *H05K 1/0296* (2013.01); *H05K 1/144* (2013.01); *H05K 2201/10128* (2013.01)

(58) Field of Classification Search
CPC .............. G02F 1/1345; G02F 1/13452; G02F 1/13454; G02F 1/13456; G02F 1/13458; G02F 1/13338
See application file for complete search history.

(56) References Cited

U.S. PATENT DOCUMENTS

2019/0244906 A1* 8/2019 Min ...................... H01L 23/498

* cited by examiner

*Primary Examiner* — Dung T Nguyen
(74) *Attorney, Agent, or Firm* — McDermott Will & Emery LLP (57) ABSTRACT

A substrate assembly, a display substrate and a display device are provided. The substrate assembly includes a cover plate and a functional substrate which are stacked. The functional substrate includes a plurality of first conductive terminals, and the cover plate includes a plurality of second conductive terminals. The plurality of the first conductive terminals are bonded to the plurality of the third conductive terminals through a plurality of connectors, and the plurality of the third conductive terminals are coupled to the plurality of the second conductive terminals through traces.

19 Claims, 7 Drawing Sheets

SUBSTRATE ASSEMBLY, DISPLAY PANEL AND DISPLAY DEVICE

CROSS-REFERENCE TO RELATED APPLICATION

This application claims priority to Chinese Patent Application No. 201810738967.8, filed with the Chinese Patent Office on Jul. 6, 2018, titled "A SUBSTRATE ASSEMBLY, A DISPLAY PANEL AND A DISPLAY DEVICE", which is incorporated herein by reference in its entirety.

TECHNICAL FIELD

The present disclosure relates to the field of display technologies, and in particular, to a substrate assembly, a display substrate and a display device.

BACKGROUND

At present, taking a display substrate as an example, the display substrate usually has a display area. When a plurality of display units are disposed in the display area, there are a plurality of corresponding bonding regions outside the display area. Each of the bonding regions is bonded to a control element through, for example, a bonding wire. As such, signals from the control element can control the display units within the display area to realize display.

SUMMARY

In one aspect, a substrate assembly is provided, which includes: a cover plate and a functional substrate which are stacked. The functional substrate has a functional region and a non-functional region surrounding the functional region, and the non-functional region includes a plurality of first bonding regions. The cover plate has a primary region and a peripheral region surrounding the primary region. The primary region is a vertical projection of the functional region of the functional substrate on the cover plate. The peripheral region includes a second bonding region and a plurality of third bonding regions. The number of the third bonding regions equals to or is greater than the number of the first bonding regions, and each of the first bonding regions has one of the third bonding regions corresponding thereto. The functional substrate includes a plurality of first conductive terminals located in each first bonding region. The cover plate includes a plurality of second conductive terminals located in the second bonding region, and a plurality of third conductive terminals located in each third bonding region. The plurality of the first conductive terminals in each of the first bonding regions are bonded to the plurality of third conductive terminals in one corresponding third bonding region through one connector in a one-to-one, many-to-one, or one-to-many manner. The plurality of the third conductive terminals in each of the third bonding regions are coupled to the plurality of the second conductive terminals in the second bonding region through at least one trace in a one-to-one, many-to-one, or one-to-many manner.

In some embodiments, the vertical projection of a functional substrate on the cover plate covers the primary region and does not overlap with the peripheral region.

In some embodiments, the plurality of the first conductive terminals in each of the first bonding regions are bonded to the plurality of the third conductive terminals in one corresponding third bonding region through one connector in a one-to-one manner; or, the plurality of the third conductive terminals in each of the third bonding regions are coupled to the plurality of the second conductive terminals in the second bonding region through a plurality of traces in a one-to-one manner.

In some embodiments, the plurality of the first conductive terminals in each of the first bonding regions are bonded to the plurality of the third conductive terminals in one corresponding third bonding region through one connector in a one-to-one manner; and, the plurality of the third conductive terminals in each of the third bonding regions are coupled to the plurality of the second conductive terminals in the second bonding region through a plurality of traces in a one-to-one manner.

In some embodiments, each of the first bonding regions and a corresponding third bonding region are located on a same side of the functional region.

In some embodiments, a plurality of connectors do not overlap at the stacking direction of the functional substrate and the cover plate.

In some embodiments, each of the connectors is an FPC, FFC or PCB.

In some embodiments, the second conductive terminals, the third conductive terminals and the traces are made of the same material.

In some embodiments, the second conductive terminals, the third conductive terminals and the traces are produced in the peripheral region of the cover plate by a printing process.

In some embodiments, the cover plate further includes: a first substrate and a light shielding structure disposed on the first substrate. The light shielding structure is located in the peripheral region. Each of the second conductive terminals, each of the third conductive terminals and each of the traces are disposed on a side of the light shielding structure facing the first substrate or a side of the light shielding structure away from the first substrate.

In some embodiments, the light shielding structure is made of black ink or black resin.

In some embodiments, the substrate assembly further includes an adhesive layer configured to join the functional substrate to the cover plate.

In some embodiments, the adhesive layer is made of optically clear adhesive (OCA) and/or liquid optically clear adhesive (LOCA).

In some embodiments, the functional substrate is a display substrate or a touch substrate.

In some embodiments, the functional substrate is a touch substrate. The touch substrate includes: a second substrate, and a plurality of emission electrodes and a plurality of sensing electrodes disposed on the second substrate and located in the functional region. The plurality of the emission electrodes and the plurality of the sensing electrodes are located in a same layer or in different layers.

In some embodiments, the cover plate further includes a first substrate, and the functional substrate further includes a second substrate. The first conductive terminals are disposed on a side of the second substrate away from the cover plate, and the third conductive terminals are disposed on a side of the first substrate facing the functional substrate.

In some embodiments, the cover plate further includes a first substrate, and the functional substrate further includes a second substrate. The first conductive terminals are disposed on a side of the second substrate facing the cover plate, and the third conductive terminals are disposed on a side of the first substrate facing the functional substrate.

In another aspect, a display panel is provided, which includes a substrate assembly described above and an opposite substrate disposed on a side of the functional substrate away from the cover plate.

In some embodiments, the functional substrate is a touch substrate, and the opposite substrate is a display substrate; or, the functional substrate is an array substrate, and the opposite substrate is a color film substrate or a protection substrate.

In yet another aspect, a display device is provided, which includes a control board, and a display panel described above. Each of the second conductive terminals located in the second bonding region is configured to be coupled to the control board.

DETAILED DESCRIPTION

In order to make the objects, technical solutions and advantages of embodiments of the present disclosure clearer, the technical solutions in the embodiments of the present disclosure will be described clearly and completely with reference to the accompanying drawings in the embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

Figure 1:
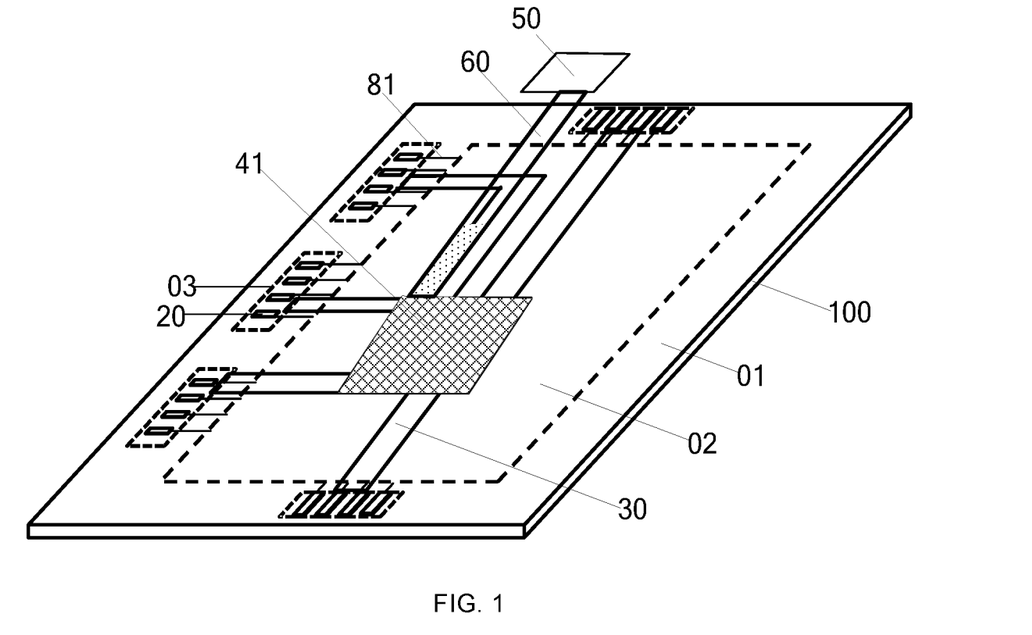
FIG. 1 is a schematic diagram of a structure of a display device.

A structure of a display device including a display substrate 100 relating to the related art is as shown in FIG. 1. In the related art, some display substrates are provided with a plurality of bonding regions based on different design requirements. Taking the display device including a narrow frame display substrate having a large size as an example, when a width of a region outside a region where the display substrate implements desired functions is narrow, setting only one bonding region 03 cannot be able to couple the signal wires 81 (which are connecting the conductive terminals 20 to functional elements in the region configured to achieve desired functions) to the conductive terminals 20 located in the bonding region 03, due to a limited wiring space of the display substrate 100. Therefore it is necessary to set a plurality of bonding regions 03 to ensure that the signal wires 81 and each of the conductive terminals 20 can be normally coupled.

A plurality of patterning processes are usually involved in a manufacturing process of the display substrate, and each patterning process requires a mask. However, for a display substrate having a large size, when the size of the display substrate is larger than an area of the maximum effective functional region of the mask (the maximum effective functional region, i.e., a total region of a photoetching layer under the mask that can be exposed by the mask), it is necessary to perform a splicing exposure including multi-times of exposure using the mask to fabricate the display substrate. Since the mask has a pattern region corresponding to a plurality of conductive terminals (i.e., Bonding Pads, also called Pins) in a bonding region, a bonding region 03 is formed via each time of exposure. Therefore, a plurality of bonding regions 03 are formed after a splicing exposure including multi-times of exposure is performed.

But the present disclosure is not restricted to this, when the size of the display substrate is not larger than an area of the maximum effective functional region of the mask, the mask may be made to have a plurality of pattern regions corresponding to a plurality of bonding regions. This way, a plurality of bonding regions 03 are also formed without a splicing exposure including multi-times of exposure.

Figure 2:
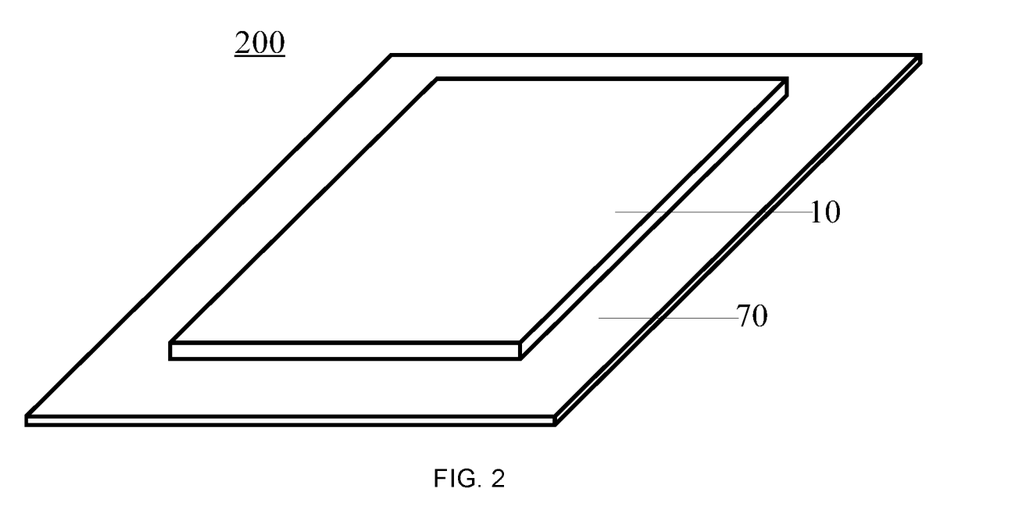
FIG. 2 is a schematic diagram of an overall structure of a substrate assembly provided by some embodiments of the present disclosure.
Figure 3:
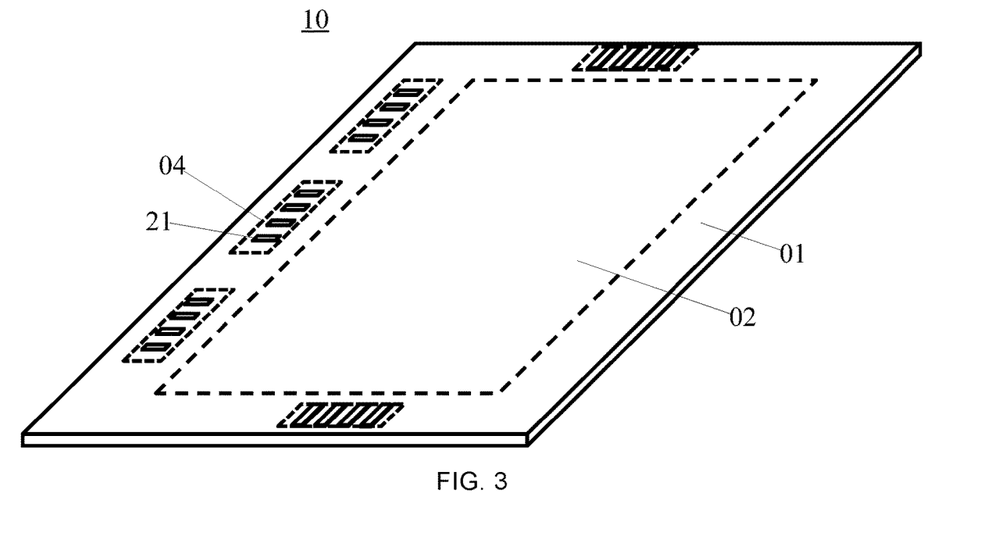
FIG. 3 is a schematic diagram of a structure of a functional substrate in the substrate assembly provided by some embodiments of the present disclosure.
Figure 4:
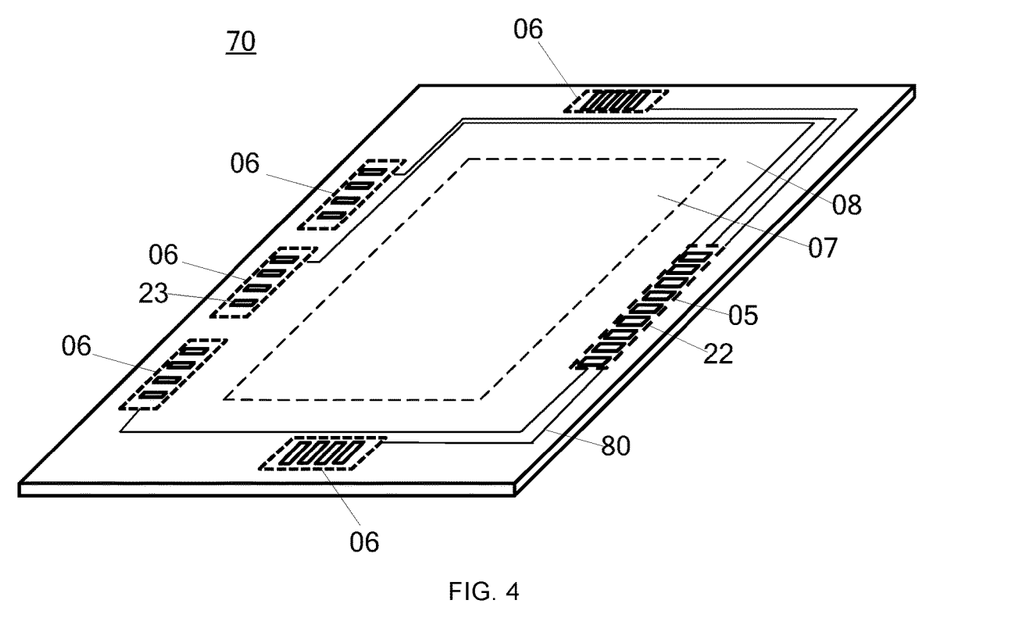
FIG. 4 is a schematic diagram of a structure of a cover plate in the substrate assembly provided by some embodiments of the present disclosure.

Some embodiments of the present disclosure provide a substrate assembly 200, as shown in FIGS. 2-4.

As shown in FIG. 2, the substrate assembly 200 includes a cover plate 70 and a functional substrate 10 which are stacked.

As shown in FIG. 3, the functional substrate 10 has a functional region 02 and a non-functional region 01 surrounding the functional region 02, and the non-functional region 01 includes a plurality of first bonding regions 04. The functional substrate 10 includes a plurality of first conductive terminals 21 located in each first bonding region 04.

As shown in FIG. 4, the cover plate 70 has a primary region 07 and a peripheral region 08 surrounding the primary region 07. The primary region 07 is a vertical projection of the functional region 02 of the functional substrate 10 on the cover plate 70. The peripheral region 08 includes a second bonding region 05 and a plurality of third bonding regions 06. The number of the third bonding regions 06 can equal to or be greater than the number of the first bonding regions 04, and each of the first bonding regions 04 has one of the third bonding regions 06 corresponding thereto. The cover plate 70 includes a plurality of second conductive terminals 22 located in the second bonding region 05, and a plurality of third conductive terminals 23 located in each third bonding region 06.

The plurality of the first conductive terminals 21 in each of the first bonding regions 04 are bonded to the plurality of the third conductive terminals 23 in one corresponding third bonding region 06 through one connector 90 in a one-to-one, many-to-one, or one-to-many manner. The plurality of the third conductive terminals 23 in each of the third bonding regions 06 are coupled to the plurality of second conductive terminals 22 in the second bonding region 05 through at least one trace 80 in a one-to-one, many-to-one, or one-to-many manner.

In some embodiments of the present disclosure, when the substrate assembly 200 is put into use, the plurality of second conductive terminals 22 in the second bonding region 05 are coupled to an external control element, signals can be supplied to the second bonding region 05 on the cover plate 70, and then transmitted to some corresponding first bonding regions 04 via the plurality of third bonding regions 06 disposed on the cover plate 70. As such, signals from the external control element can control functional units within the functional substrate 10 to realize corresponding functions.

It will be noted that, the number of the first bonding regions 04 included in the non-functional region 01 of the functional substrate 10 is not limited, and can be set correspondingly according to the size of the functional substrate 10 and the width of the non-functional region 01. An end of each first conductive terminal 21 in each of the first bonding regions 04 can be coupled to one signal wire in the functional substrate 10 to provide corresponding signals to a structure in the functional substrate 10.

In FIG. 3, the non-functional region 01 including five first bonding regions 04 is taken as an example. In FIG. 4, the peripheral region 08 including five third bonding regions 06 is taken as an example. That is, the number of the third bonding regions 06 equals to the number of the first bonding regions 04.

Herein, it is just necessary to make sure each of the first bonding regions 04 has one third bonding region 06 corresponding thereto. In a case that the number of the third bonding regions 06 is greater than the number of the first bonding regions 04, the third bonding region(s) 06 without the corresponding first bonding region(s) 04 can be coupled to other circuit structure(s) according to specific requirements, which is not limited by embodiments of the present disclosure.

In FIG. 3, that each first bonding region 04 includes four first conductive terminals 21 is taken as an example.

In FIG. 4, with regard to each third bonding region 06, for the sake of clarity, it is only showed that each third bonding region 06 is integrally connected to the second bonding region 05 through a trace 80. Each of the third bonding regions 06 in FIG. 4 including four third bonding terminals 23 is taken as an example. For a third bonding region, four third conductive terminals 23 in the third bonding region 06 can be coupled to four second conductive terminals 22 in the second bonding region 05 through four traces 80, or four third conductive terminals 23 in the third bonding region 06 can be coupled to one second conductive terminal 22 in the second bonding region 05 through one trace 80.

Depending on a specific requirement of a circuit structure, the plurality of the first conductive terminals 21 in each of the first bonding regions 04 are bonded to the plurality of the third conductive terminals 23 in a corresponding third bonding region 06 through one connector 90 in a one-to-one, many-to-one, or one-to-many manner.

Figure 6A:
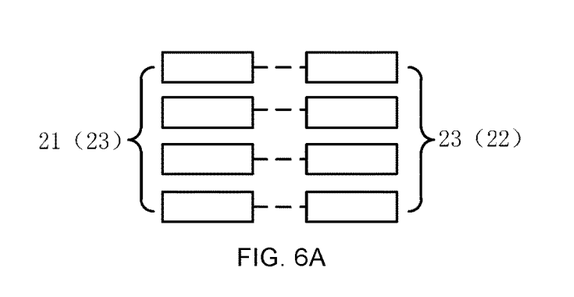
FIG. 6A is a schematic diagram of a one-to-one manner with which various conductive terminals are coupled to each other provided by some embodiments of the present disclosure.

Illustratively, with regard to the one-to-one manner, one first conductive terminal 21 is bonded to one third conductive terminal 23 through one connector 90. Herein, the number of the third conductive terminals 23 in one third bonding region 06 can equal to the number of the first conductive terminals 21 in one corresponding first bonding region 04. FIG. 6A shows the above two kinds of conductive terminals bonded in a one-on-one manner.

Figure 6B:
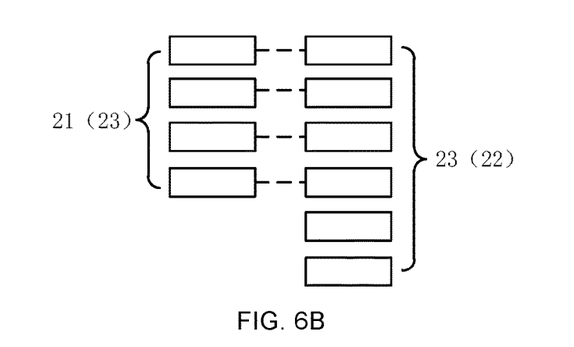
FIG. 6B is a schematic diagram of another one-to-one manner with which various conductive terminals are coupled to each other provided by some embodiments of the present disclosure.

Or, the number of the third conductive terminals 23 in one third bonding region 06 can be greater than the number of the first conductive terminals 21 in one corresponding first bonding region 04. FIG. 6B shows the above two kinds of conductive terminals bonded in a one-on-one manner. That is, for one first bonding region 04 and one third bonding region 06 corresponding thereto, each of the first conductive terminals 21 in the first bonding region 04 is coupled to one third conductive terminal 23, and the third conductive terminal(s) 23 without the corresponding first conductive terminal(s) 21 may be coupled to other circuit structure(s) according to specific requirements, which is not limited by embodiments of the present disclosure.

Figure 6C:
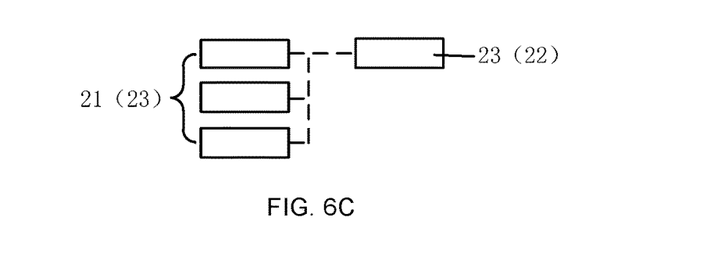
FIG. 6C is a schematic diagram of a many-to-one manner with which various conductive terminals are coupled to each other provided by some embodiments of the present disclosure.

With regard to the many-to-one manner, the plurality of first conductive terminals 21 are bonded to one third conductive terminal 23 through one connector 90. FIG. 6C shows the above two kinds of conductive terminals bonded in a many-to-one (for example, three-to-one) manner.

Figure 6D:
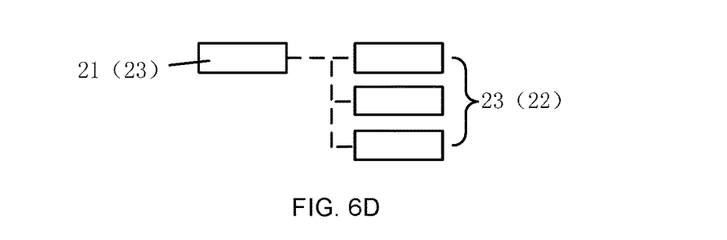
FIG. 6D is a schematic diagram of a one-to-many manner with which various conductive terminals are coupled to each other provided by some embodiments of the present disclosure.

With regard to the one-to-many manner, one first conductive terminal 21 is bonded to a plurality of third conductive terminals 23 through one connector 90. FIG. 6D shows the above two kinds of conductive terminals bonded in a one-to-many (for example, one-to-three) manner.

When the first bonding regions 04 are bonded to the corresponding third bonding regions 06, the first conductive terminals 21 in one first bonding region 04 are all bonded to the third conductive terminals 23 in the corresponding third bonding region 06 through one connector 90.

With regard to any two first bonding regions 04, a bonding manner of the plurality of first conductive terminals 21 being bonded to the plurality of corresponding third conductive terminals 23 through a connector 90 when one first bonding region 04 is boned to its corresponding third bonding region 06, can be the same as or different from a bonding manner of the plurality of first conductive terminals 21 being bonded to the plurality of corresponding third conductive terminals 23 through a connector 90 when the other first bonding region 04 is boned to its corresponding third bonding region 06. That is, when each first bonding region 04 is boned to one corresponding third bonding region 06, the connection manner(s) of various conductive terminals can be set according to specific requirements, which is not limited by embodiments of the present disclosure.

For a manner of the first conductive terminals 21 in one first bonding region 04 being coupled to the third conductive terminals 23 in the corresponding third bonding region 06, one or more of the one-to-one, many-to-one, and one-to-many manners can be used for coupling. As for the specific manners of coupling, reference may be made to the foregoing description, and details are not described herein again.

Similarly, depending on a specific requirement of a circuit structure, the plurality of third conductive terminals 23 in each of the third bonding regions 06 are coupled to the plurality of second conductive terminals 22 in the second bonding region 05 through at least one trace 80 in the one-to-one, many-to-one, or one-to-many manner.

Illustratively, with regard to the one-to-one manner, one third conductive terminal 23 is bonded to one second conductive terminal 22 through one trace 80.

Herein, the number of the second conductive terminals 22 in the second bonding region 05 may equal to the sum of the number of the third conductive terminals 23 in all of the third bonding regions 06. FIG. 6A shows the above two kinds of conductive terminals coupled in a one-on-one manner.

Or, the number of the second conductive terminals 22 in the second bonding region 05 may be greater than the sum of the number of the third conductive terminals 23 in all of the third bonding regions 06. FIG. 6B shows the above two kinds of conductive terminals coupled in a one-on-one manner. That is, for the second bonding region 05 and all of the third bonding regions 06, each of the third conductive terminals 23 in the third bonding region 06 is coupled to one second conductive terminal 22, and the second conductive terminal(s) 22 without corresponding third conductive terminal(s) 23 may be coupled to other circuit structure(s) according to specific requirements, which is not limited by embodiments of the present disclosure.

Illustratively, as shown in FIG. 4, the peripheral region 08 includes five third bonding regions 06, and each of the third bonding regions 06 is provided with four third conductive terminals 23. Thus, the number of the second conductive terminals 22 located in the second bonding region 05 should be at least 20.

With regard to the many-to-one manner, the plurality of third conductive terminals 23 are bonded to one second conductive terminal 22 through one trace 80. FIG. 6C shows the above two kinds of conductive terminals coupled in a many-to-one manner, for example, three-to-one.

With regard to the one-to-many manner, one third conductive terminal 23 is bonded to a plurality of second conductive terminals 22 through one trace 80. FIG. 6D shows the above two kinds of conductive terminals coupled in a one-to-many manner, for example, one-to-three.

The manner(s) of connection between the various conductive terminals is schematically illustrated in FIGS. 6A-6D. The dotted line only indicates a connection manner between the conductive terminals, which is not limited to specific lines connecting the various conductive terminals here.

When the third bonding regions 06 are coupled to the second bonding region 05, the third conductive terminals 23 in all of the third bonding regions 06 are all bonded to the second conductive terminals 22 in the second bonding region 05 through the traces 80.

With regard to any two third bonding regions 06, a bonding manner of the plurality of third conductive terminals 23 being coupled to the plurality of second conductive terminals 22 through the at least one trace 80 when one third bonding region 06 is coupled to the second bonding region 05, can be the same as or different from a bonding manner of the plurality of third conductive terminals 23 being coupled to the plurality of second conductive terminals 22 through the at least one trace 80 when the other third bonding region 06 is coupled to the second bonding region 05. That is, the manner of each of the third bonding regions 06 being coupled to the second bonding region 05 can be set according to specific requirements, which is not limited by embodiments of the present disclosure.

For a manner of the third conductive terminals 23 in one third bonding region 06 being coupled to the second conductive terminals 22 in the second bonding region 05, one or more of the one-to-one, many-to-one, and one-to-many manners can be used for coupling. As for the specific manners of coupling, reference may be made to the foregoing description, and details are not described herein again.

Based on this, in the substrate assembly 200 provided by some embodiments of the present disclosure, the first conductive terminals 21 located in each of the first bonding regions 04 of the functional substrate 10 are coupled to the third conductive terminals 23 located in the corresponding third bonding region 06 of the cover plate 70, and the third conductive terminals 23 in each of the third bonding regions 06 are coupled to the second conductive terminals 22 of the second bonding region 05, which is equivalent to that: each of the first conductive terminals 21 in each of the first bonding regions 04 of the functional substrate 10 is indirectly coupled to the plurality of second conductive terminals 22 in the second bonding region 05 of the cover plate 70 through the plurality of third conductive terminals 23 in the corresponding third bonding regions 06. Thus, in a case that the second bonding region 05 is also coupled to an external control element, signals can be supplied to each of the first bonding regions 04 of the functional substrate 10 through the second bonding region 05, such that the external control element is not required to provide signals to each of the first bonding regions 04 respectively, thereby simplifying the coupling manner with the external control elements.

When the position of the external control element is changed due to design requirements, since each of the first bonding regions 04 in the functional substrate 10 is not coupled to the external control element, it only needs to adjust the coupling between the second bonding region 05 and the external control element, and does not need to change the coupling manner of other regions. Thereby, further simplifying the coupling manner of the substrate assembly 200 provided by some embodiments of the present disclosure with the external control element, which helps to improve the adaptability of the substrate assembly 200 in specific applications.

In addition, in the above substrate assembly 200, since the cover plate 70 and the functional substrate 10 are stacked, the cover plate 70 can also provide a certain protection for the functional substrate 10.

It is required that each of the first bonding regions 04 on the functional substrate 10 is bonded to the corresponding third bonding region 06 on the cover plate 70. For simplifying the design, in some embodiments of the present disclosure, the vertical projection of the functional substrate 10 on the cover plate 70 covers the primary region 07 and does not overlap with the peripheral region 08. That is, there is a space between the primary region 07 and the peripheral region 08, the vertical projection of the functional substrate 10 on the cover 70 is larger than the primary region 07, and the peripheral region 08 surrounds the vertical projection of the functional substrate 10 on the cover 70.

One first bonding region 04 is bonded to one corresponding third bonding region 06 through one connector 90, and all of the first bonding regions 04 are bonded to the corresponding third bonding regions 06. In some embodiments of the present disclosure, the plurality of first conductive terminals 21 in each of the first bonding regions 04 are bonded to the plurality of third conductive terminals 23 in one corresponding third bonding region 06 through one connector 90 in the one-to-one manner.

All of the third conductive terminals 23 are coupled to the second conductive terminals 22 through a plurality of traces 80. In some embodiments of the present disclosure, the plurality of third conductive terminals 23 in each of the third bonding regions 06 are coupled to the plurality of second conductive terminals 22 in the second bonding region 05 through the plurality of traces 80 in the one-to-one manner.

In some embodiments of the present disclosure, the plurality of first conductive terminals 21 in each of the first bonding regions 04 are bonded to the plurality of third conductive terminals 23 in one corresponding third bonding region 06 through one connector 90 in the one-to-one manner, and the plurality of third conductive terminals 23 in each of the third bonding regions 06 are coupled to the plurality of second conductive terminals 22 in the second bonding region 05 through a plurality of traces 80 in the one-to-one manner.

In some embodiments of the present disclosure, one first bonding region 04 and its corresponding third bonding region 06 are located on the same side of the functional region 02. Thus, when any one of the first bonding areas 04 is bonded to its corresponding third bonding area 06, it is not necessary to provide a connector with a large size.

It will be noted that, in order to couple the first conductive terminals 21 located in the first bonding regions 04 to the third conductive terminals 23 located in the third bonding regions 06 through the connectors 90, in which the first and third bonding regions are located on the same side of the functional region 02, in some embodiments, after stacking the cover plate 70 and the functional substrate 10, the number of the third bonding regions 06 is set to equal to or be greater than the number of the first bonding regions 04 when designing positions of the third bonding regions 06.

Figure 5:
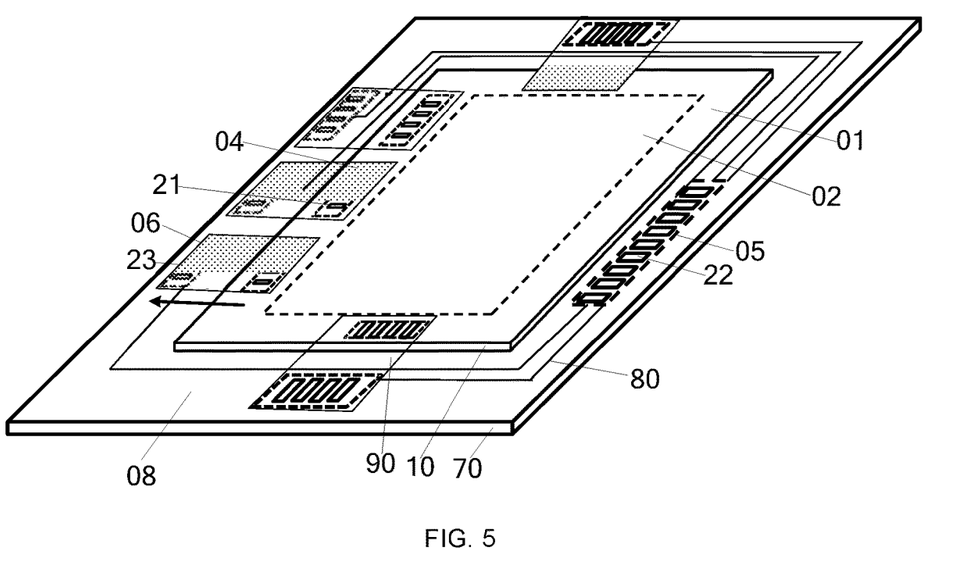
FIG. 5 is a schematic diagram of a structure of another substrate assembly provided by some embodiments of the present disclosure.

Here, "the same side" means that: as shown in FIG. 5, the non-functional region 01 of the functional substrate 10 has five first bonding regions 04, and the peripheral region 08 of the cover plate 70 has five third bonding regions 06; three first bonding regions 04 and three corresponding third bonding regions 06 are located on the left side of the functional area 02 in FIG. 5, one first bonding region 04 and one corresponding third bonding region 06 are located on the upper side of the functional region 02 in FIG. 5, and one first bonding region 04 and one corresponding third bonding region 06 are located on the lower side of the functional region 02 in FIG. 5. All of the above belong to that the first bonding region 04 and the corresponding third bonding region 06 are located on the same side of the functional region 02.

In some embodiments, after stacking the cover plate 70 and the functional substrate 10, the number of the third bonding regions 06 equals to the number of the first bonding regions 04, in which the first and third bonding regions are located on the same side of the functional region 02.

If a first bonding region 04 and a third bonding region 06 which are bonded through the connector 90 are located on different sides of the functional region 02, on the one hand, the length of the connector 90 increases along the bonding direction (shown by an arrow in FIG. 5) of the first conductive terminals 21 and the third conductive terminals 23; on the other hand, when the first conductive terminals 21 located in the first bonding region 04 are bonded to the third conductive terminals 23 in the third bonding region 06 through the connector 90, the connector 90 may be bent, thereby reducing the service life and reliability of the connector 90.

On this basis, the first conductive terminals 21 located in the first bonding regions 04 are bonded to the third conductive terminals 23 located in the third bonding regions 06 through the connectors 90, in which the first and third bonding regions are located on the same side of the functional region 02. In some embodiments, in order to facilitate bonding, the first conductive terminals 21 in a first bonding region 04 are bonded to the third conductive terminals 23 in the third bonding region 06 which is nearest the first boding region on the same side of the functional region 02 through the connector 90. In this case, the length of the connector 90 is the shortest along the bonding direction (shown by an arrow in FIG. 5) of the first conductive terminals 21 and the third conductive terminals 23.

Based on this, the positions of the plurality of first bonding regions 04 on the functional substrate 10 can be designed according to the corresponding product requirements, and the positions of the third bonding regions 06 in the peripheral region 08 of the cover plate 70 can be designed based on the positions of the plurality of first bonding regions 04, such that the positions of the first bonding regions 04 are closed to the positions of the corresponding third bonding regions 06. In this case, when the first conductive terminals 21 located in one first bonding region 04 are bonded to the third conductive terminals 23 located in one third bonding region 06 through the connector 90, the length of the connector 90 in the bonding direction of the first conductive terminals 21 and the third conductive terminals 23 is the shortest.

In addition, the position of the second bonding region 05 on the cover plate 70 can be correspondingly set according to actual requirements, which is not limited in embodiments of the present disclosure.

In some embodiments of the present disclosure, a plurality of connectors 90 do not overlap in the stacking direction of the functional substrate 10 and the cover plate 70.

When the plurality of connectors 90 do not overlap in the stacking direction of the functional substrate 10 and the cover plate 70, on the one hand, the length of the connector 90 in the bonding direction of the first conductive terminals 21 and the third conductive terminals 23 can be reduced; on the other hand, the problem that signals in the connectors 90 interfere with each other due to the overlap of the plurality of connectors 90 in the stacking direction of the functional substrate 10 and the cover plate 70 is avoided.

The connector 90 is used for bonding the plurality of first conductive terminals 21 in the first bonding regions 04 to the plurality of third conductive terminals 23 in corresponding third bonding regions 06 in a one-to-one, many-to-one, or one-to-many manner, thus one connector 90 can include a plurality of wires to connect the first conductive terminals 21 with the corresponding third conductive terminals 23 through these wires.

Some embodiments of the present disclosure do not limit the type of the connector 90. For example, the connector 90 may be an Flexible Printed Circuit (FPC), an Flexible Flat Cable (FFC), a Printed circuit board (PCB), or the like.

The connector 90 can also be a Printed Circuit Board Assembly (PCBA) belonging to the PCB type.

In some embodiments of the present disclosure, the second conductive terminals 22, the third conductive terminals 23 and the traces 80 are made of the same material.

The second conductive terminals 22, the third conductive terminals 23 and the traces 80 can be formed on the cover plate 70 by a single patterning process. Illustratively, the second conductive terminals 22, the third conductive terminals 23 and the traces 80 can be formed on the cover plate 70 by a patterning process including an exposure step using a mask, a developing step and an etching step. Or, the second conductive terminals 22, the third conductive terminals 23 and the traces 80 can be formed on the cover plate 70 by a printing process.

In some embodiments of the present disclosure, the second conductive terminals 22, the third conductive terminals 23 and the traces 80 are disposed in the peripheral region 08 of the cover plate 70 by a printing process.

The second conductive terminals 22, the third conductive terminals 23 and the traces 80 can be disposed in the peripheral region 08 of the cover plate 70 at once by the printing process. When the positions of the second conductive terminals 22, the third conductive terminals 23 and the traces 80 on the cover 70 are changed due to design requirements, the cover plate having a new arrangement can be achieved at a lower cost by the printing process.

With regard to the display substrate 100 of the related art in FIG. 1, the display substrate 100 includes conductive terminals 20 located in bonding regions 03. The conductive terminals 20 need to bond with the bonding wires 30, and the conductive terminals 20 located in the bonding regions 03 are formed through a patterning process (including an exposure step using a mask, a developing step, and an etching step). When the bonding wires 30 have different position requirements to the bonding regions 03 bonded with the bonding wires 30, due to the reasons such as the setting positions of the bonding wires 30 or the like, it is necessary to develop a new mask to satisfy the requirements of the position change of the bonding regions 03.

Figure 9:
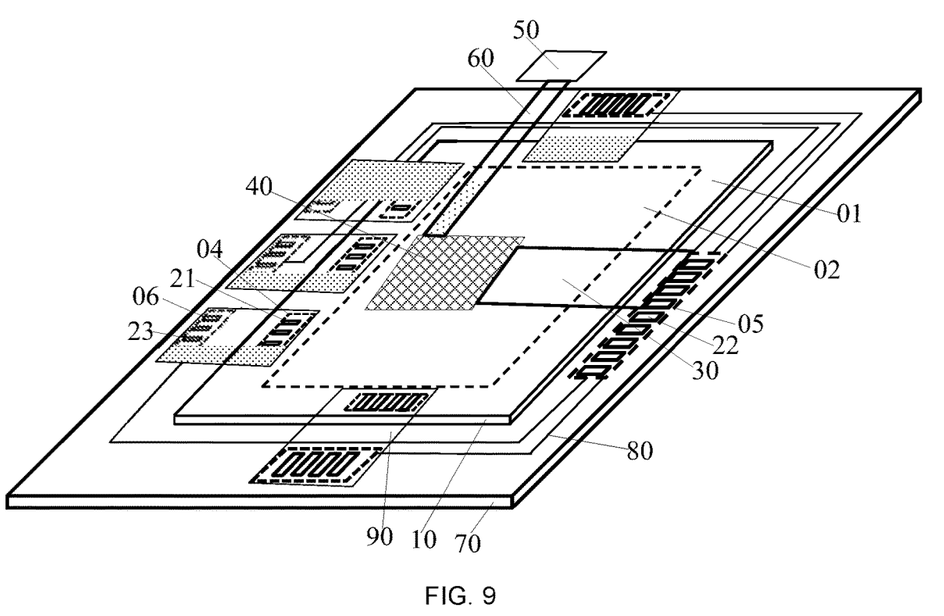
FIG. 9 is a schematic diagram of a structure of a display device provided by some embodiments of the present disclosure.

In some embodiments of the present disclosure, as shown in FIG. 9, the second conductive terminals 22 in the second bonding region 05 are bonded to bonding wire 30, and the first conductive terminals 21 located in the first bonding regions 04 of the functional substrate 10 do not need to be bonded to the bonding wire 30, such that when the requirement of the setting position of the bonding wire 30 is changed, it is only need to change the position of the second bonding region 05.

The second conductive terminals 22 located in the second bonding region 05 of the cover plate 70 is disposed by, for example, a printing process. Even if the position of the second bonding region 05 is changed, it is not necessary to develop a new mask for using in the patterning process for forming individual conductive terminals on the cover plate 70. Therefore, the substrate assembly 200 provided by some embodiments of the present disclosure does not cause a substantial increase in cost, and greatly improves the scope of application of products.

Figure 7:
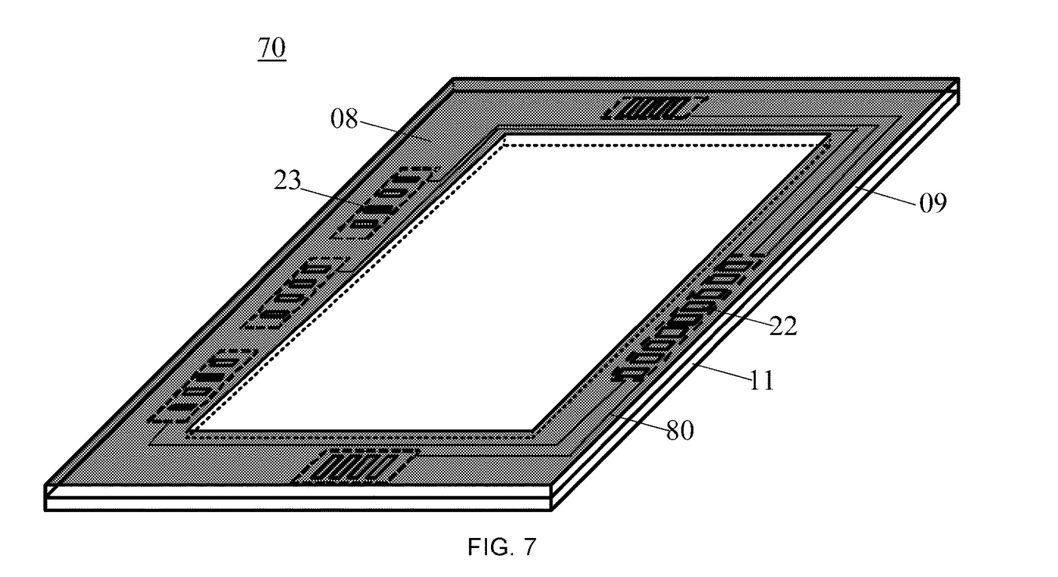
FIG. 7 is a schematic diagram of a structure of another cover plate in the substrate assembly provided by some embodiments of the present disclosure.

In some embodiments of the present disclosure, as shown in FIG. 7, the cover plate 70 further includes a first substrate 11 and a light shielding structure 09 (such as a light shielding layer) disposed on the first substrate 11. The light shielding structure 09 is located in the peripheral region 08. Each of the second conductive terminals 22, each of the third conductive terminals 23 and each of the traces 80 are disposed on a side of the light shielding structure 09 facing the first substrate 11 or a side away from the first substrate 11.

In some embodiments, as shown in FIG. 7, the light shielding structure 09 located in the perimeter region 08 can be annular. The vertical projection of the light shielding structure 09 in the stacking direction of the substrate assembly 200 can be equivalent to the peripheral region 08 to achieve better light shielding effects.

The first substrate 11 can be made of a transparent rigid material, such as glass, or a transparent flexible material, such as polyimide film, which is not limited by some embodiments of the present disclosure.

Illustratively, the light shielding structure 09 can be made of ink, resin or other materials, which has black, white or other colors. In some embodiments, the light shielding structure 09 can be used as a frame for the product. Herein, there is no limitation on how to form the light shielding structure 09 in the peripheral region 08 of the cover 70. The light shielding structure 09 can be formed in the peripheral region 08 by spraying, printing, gluing, laminating or the like. In some embodiments, the light shielding structure 09 is formed in the peripheral region 08 of the cover plate 70 by a printing process.

With the shielding effect of the light shielding structure 09, a user can not see the second conductive terminals 22, the third conductive terminals 23 and the traces 80 in the peripheral region 08 of the cover plate 70 when the user is using the product made from the substrate assembly 200 of the present disclosure, thereby improving the aesthetics of the product.

Some embodiments of the present disclosure do not limit how to fix the functional substrate 10 and the cover plate 70 together. For example, the functional substrate 10 and the cover plate 70 can be fixed together by a fixing component (for example, a middle frame), or the functional substrate 10 and the cover plate 70 can be fixed together by an adhesive.

In order to simplify the structure, in some embodiments of the present disclosure, the functional substrate 10 and the cover plate 70 are bound together through Optical Clear Adhesive (OCA) and/or Liquid Optical Clear Adhesive (LOCA, also referred to as Optical Clear Resin or UV curable resin).

In some embodiments, the functional substrate 10 is a display substrate or a touch substrate. When the function substrate 10 is a display substrate, the function region 02 is a display area, and the non-functional region 01 is a non-display area. When the function substrate 10 is a touch substrate, the function region 02 is a touch area, and the non-functional region 01 is a non-touch area.

In some embodiments, the functional substrate 10 is a display substrate. The type of the display substrate is not limited and can be, for example, an array substrate. The substrate assembly 200 can be used to form the following display devices, such as a Liquid Crystal Display (LCD), an Organic Light-Emitting Diode Display (OLED) and the like.

Figure 10:
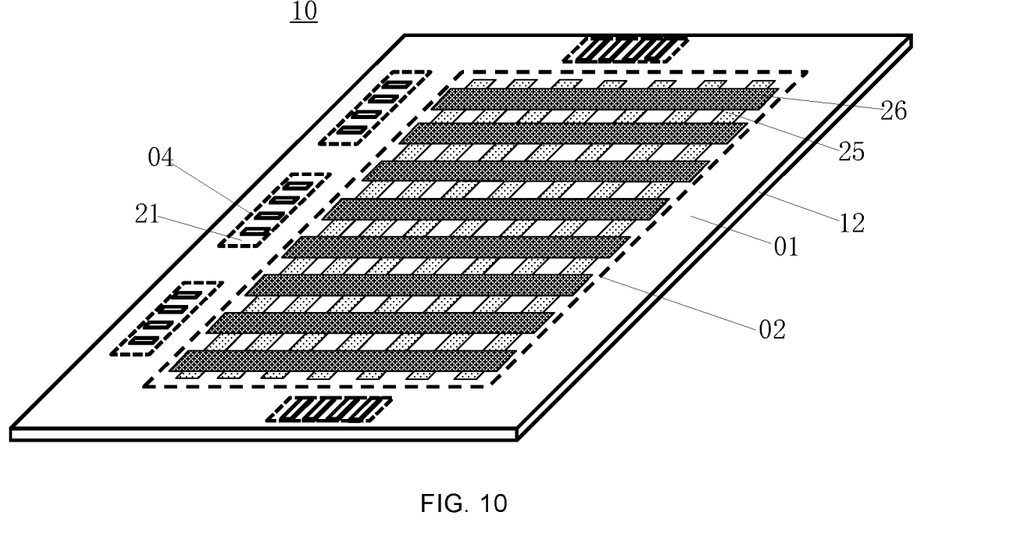
FIG. 10 is a schematic diagram of a structure of functional substrate in a substrate assembly provided by some embodiments of the present disclosure, in which the functional substrate is a touch substrate.

In some embodiments, the functional substrate 10 is a display substrate. As shown in FIG. 10, the touch substrate further includes a second substrate 12, and a plurality of emission electrodes 25 and a plurality of sensing electrodes 26, which are disposed on the second substrate 12 and located in the functional region 02. The plurality of emission electrodes 25 and the plurality of sensing electrodes 26 are located in the same layer or in different layers.

Herein, FIG. 10 only illustrates a case that the plurality of emission electrodes 25 and the plurality of sensing electrodes 26 are located in different layers, and the plurality of emission electrodes 25 and the plurality of sensing electrodes 26 are separated by a transparent insulating layer. Some embodiments of the present disclosure do not limit the specific arrangement of the plurality of emission electrodes 25 and the plurality of sensing electrodes 26 as long as the touch function can be implemented.

For example, the touch substrate can be a glass-glass touch substrate (GG touch substrate), a glass-film-film touch substrate (GFF touch substrate), a glass-film touch substrate (GF touch substrate), a one glass solution touch substrate (OGS touch substrate), or the like.

Herein, the material of the second substrate 12 is not limited, and can be a transparent flexible material (such as polyimide film) or a transparent rigid material (such as glass). That is, the plurality of emission electrodes 25 and the plurality of sensing electrodes 26 can be formed on a polyimide film or can be formed on a piece of glass.

It will be noted that, with respect to the GG touch substrate and the OGS touch substrate, since the plurality of emission electrodes 25 and the plurality of sensing electrodes 26 are formed on a piece of glass, when fabricating the GG touch substrate and the OGS touch substrate, the emission electrode 25, the sensing electrode 26 and the first conductive terminals 21 located in the first bonding regions 04 are formed by a patterning process. As a result, in a case that the first bonding regions 04 are directly bonded to an external element, when the coupling between the first bonding regions 04 on the GG touch substrate or the OGS touch substrate and the external control element changes, the related art needs to re-develop a mask to adapt to the changes. However, the substrate assembly 200 provided by the present disclosure does not need to re-develop a mask, and the reasons have been described in detail above, and will not be described herein again.

In some embodiments of the present disclosure, the cover plate 70 includes a first substrate 11 and the functional substrate 10 includes a second substrate 12.

Figure 8A:
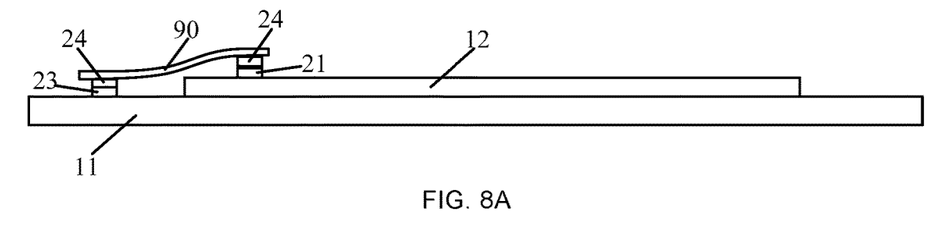
FIG. 8A is a schematic diagram of a manner for bonding the functional substrate and the cover plate together through a connector, in the substrate assembly provided by some embodiments of the present disclosure.

As shown in FIG. 8A, in some embodiments, the first conductive terminals 21 are disposed on a side of the second substrate 12 away from the cover plate 70, and the third conductive terminals 23 are disposed on a side of the first substrate 11 facing the functional substrate 10. Bonding terminals 24 of the connector 90 for bonding are located on the same surface of the connector 90.

Figure 8B:
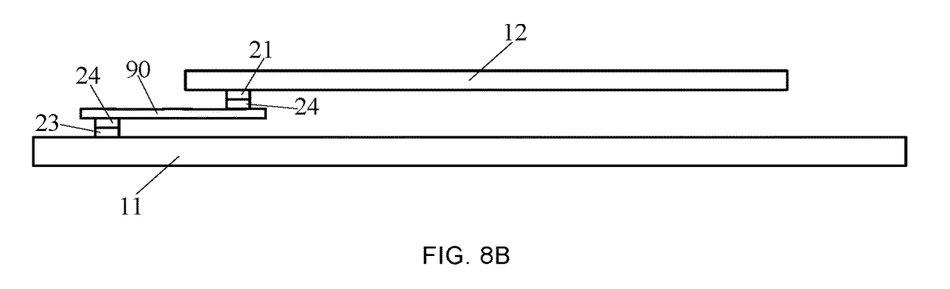
FIG. 8B is a schematic diagram of another manner for bonding the functional substrate and the cover plate together through a connector, in the substrate assembly provided by some embodiments of the present disclosure.

As shown in FIG. 8B, in some embodiments, the first conductive terminals 21 are disposed on a side of the second substrate 12 facing the cover plate 70, and the third conductive terminals 23 are disposed on a side of the first substrate 11 facing the functional substrate 10. The bonding terminals 24 of the connector 90 for bonding are located on different surfaces of the connector 90 (i.e., two opposite surfaces). At this case, the connector 90 is located between the functional substrate 10 and the cover plate 70 when bonding.

Figure 11A:
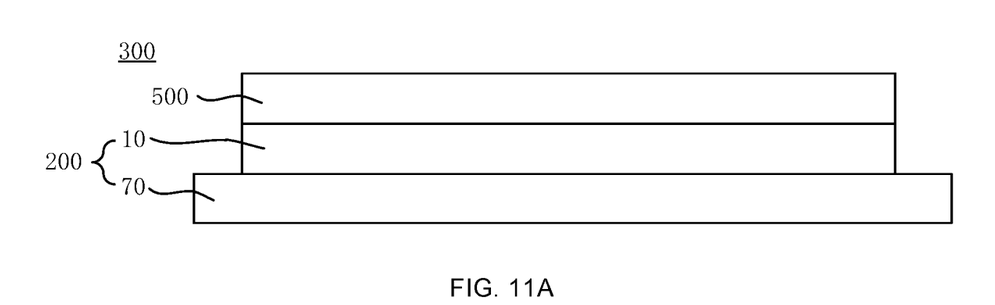
FIG. 11A is a schematic diagram of a structure of a display panel provided by some embodiments of the present disclosure.

Some embodiments of the present disclosure provide a display panel 300, and the display panel 300 includes a substrate assembly 200 described above and an opposite substrate 500 disposed on a side of the functional substrate 10 away from the cover plate 70, as shown in FIG. 11A.

Figure 11B:
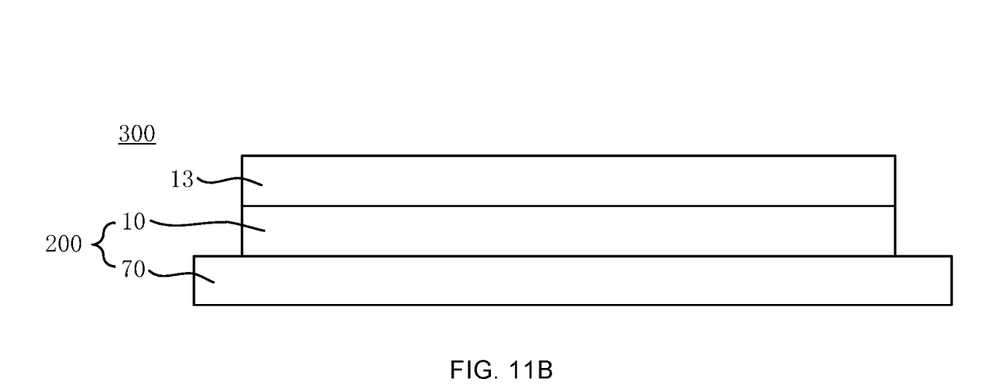
FIG. 11B is a schematic diagram of a structure of another display panel provided by some embodiments of the present disclosure.

In some embodiments, when the functional substrate 10 is a touch substrate, as shown in FIG. 11B, the opposite substrate 500 is a display substrate 13. In some embodiments, when the functional substrate 10 is a display substrate, such as an array substrate, the opposite substrate 500 is a color film substrate or a protection substrate.

The type of the display panel 300 is not limited, and can be a liquid crystal display panel or an organic light-emitting diode display panel.

Correspondingly, the functional substrate 10 in the substrate assembly can be a touch substrate or a display substrate. In some embodiments, a liquid crystal display panel is formed by using the substrate assembly. In this case, the functional substrate 10 is a display substrate (such as an array substrate), and the opposite substrate 500 is a color film substrate. The color film substrate can be disposed between the cover plate 70 and the functional substrate 10, or can be disposed on a side of the functional substrate 10 away from the cover plate 70. In some embodiments, in an OLED display panel formed by using the substrate assembly in which the functional substrate 10 is a display substrate, if the display substrate is packaged by a package substrate, the cover plate 70 can also serve as the package substrate for packaging the display substrate; if the display substrate is packaged by a film, a package film can be provided on the display substrate, and the cover plate 70 can be provided on the package film.

In some embodiments of the present disclosure, the display panel 300 includes the above-described substrate assembly 200. The substrate assembly 200 in the display panel 300 has the same technical features and advantageous effects as the above-described substrate assembly 200. The technical features and advantageous effects of the substrate assembly 200 have been described in detail above, and will not be described herein again.

Figure 12:
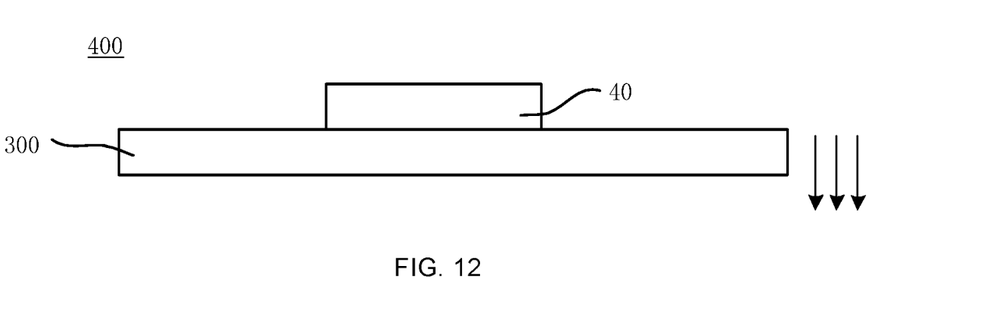
FIG. 12 is a schematic diagram of a structure of another display device provided by some embodiments of the present disclosure.

Some embodiments of the present disclosure further provide a display device 400, as shown in FIG. 12, including the above-described display panel 300 and a control board 40. As shown in FIG. 9, the second conductive terminals 22 located in the second bonding region 05 are bonded to the control board 40 through a bonding wire 30.

As shown in FIG. 12, the control board 40 is disposed in the opposite direction of the light-emitting direction (shown by an arrow in FIG. 12) of the display panel 300 so as not to affect the display of the display panel 300.

It will be understood that, for convenience of description, in FIG. 12, the display panel 300 is shown as a single layer, and the detail structure of the display panel 300 is not shown. For the structure of the display panel 300, reference may be made to the foregoing description, and details are not described herein again.

The control board 40 can be a system control board in the display device. When the functional substrate 10 is a touch substrate, the control board 40 can be a touch control board. When the functional substrate 10 is a display substrate, the control board 40 can be a display control board. The touch control board and the display control board here can be disposed on the system control board.

In addition, the bonding wire 30 can also be FPC, FFC, PCB or the like.

For the display device, as shown in FIG. 1, in the display substrate 100 of the related art, except that the conductive terminals 20 located in each bonding region 03 are bonded to the control element (such as a control board) of the display device through the bonding wire 30 (one bonding wire 30 can includes multiple wires), a signal transmission wire 60 of another module 50 (such as a camera module, an infrared module, or the like) is also coupled to the control element 41 of the display device.

The plurality of bonding regions 03 result in a plurality of bonding wires 30 that are bonded with the control element 41. The signal transmission wire 60 that couples another module 50 to the control element 41 may overlap with or be close to the bonding wires 30, as a result that signals in the bonding wires 30 and signals in the signal transmission wire 60 interfere with each other, thereby affecting normal use of the display device.

For example, when another module 50 (such as a camera module) is disposed on the top of the display device, since in the related art a plurality of bonding regions 03 are disposed on the top side and the left side of the display substrate 100, the signal transmission wire 60 may be close to or overlap with the bonding wires 30, causing the signals in the bonding wires 30 and the signals in the signal transmission wire 60 interfere with each other.

With respect to the related art, in the display device 400 including the substrate assembly 200 provided by some embodiments of the present disclosure, it is not necessary to bond the first conductive terminals 22 in each of the first bonding regions 04 to the control board 40 through the bonding wires 30, and it is only need to bond the second conductive terminals 23 located in the second bonding region 05 of the cover plate 70 to the control board 40 through one bonding wire 30.

Based on this, when the display panel 300 including the substrate assembly 200 of the present disclosure is bonded with the control board 40, the number of bonding wires 30 is reduced. When another module 50 (such as a camera module) is coupled to the control board 40, the signal transmission wire 60 coupled to the other modules 50 and the bonding wires 30 can be designed to be far apart during production, thereby avoiding the signals in the bonding wires 30 and the signals in the signal transmission wire 60 from interfering with each other.

Illustratively, as shown in FIG. 9, although the functional substrate 10 of the substrate assembly 200 includes a plurality of first bonding regions 04, the indirect connection of the plurality of first bonding regions 04 with the control board 40 can be achieved by bonding the second conductive terminals 22 in the second bonding region 05 to the control board 40.

Thus, as shown in FIG. 9, the signal transmission wire 60 coupled to another module 50 and the bonding wire 30 can be designed to be far apart, thereby avoiding the signals in the bonding wire 30 and the signals in the signal transmission wire 60 from interfering with each other.

It will be noted that, the second conductive terminals 22 located in the second bonding region 05 can be directly bonded to the control board 40 through a bonding wire (such as FPC), or the second conductive terminals 22 located in the second bonding region 05 are firstly bonded to the bonding wire, then the bonding wire is coupled to a patch panel, and the patch panel is coupled to the control board 40.

Herein, one end of the bonding wire that is bonded to the second conductive terminals 22 located in the second bonding region 05 includes a plurality of bonding terminals. In some embodiments, one bonding terminal of the bonding wire is bonded to one second conductive terminal 22 located in the second bonding region 05, and all of the second conductive terminals 22 coupled to the third conductive terminals 23 are bonded to the bonding terminals of the bonding wire.

Since the second conductive terminals 22 located in the second bonding region 05 are bonded to the control board 40 through the bonding wire 30, and each of the first conductive terminals 21 located in the first bonding regions 04 is coupled to one second conductive terminal 22 located in the second bonding region 05, the signals in the signal wires coupled to the first conductive terminals 21 in the first bonding regions 04 can be controlled by the control board 40.

Herein, the display device can be any device that displays an image whether moving (for example a video) or fixed (for example a static image), and whether literal or graphical. More specifically, it is contemplated that the described embodiments may be implemented in or associated with a variety of electronic devices. The variety of electronic devices may include (but not limit to), for example, mobile telephones, wireless devices, portable android devices (PAD), hand-held or portable computers, global positioning system (GPS) receivers/navigators, cameras, MPEG-4 Part 14 (MP4) video players, a vidicon, game consoles, watches, clocks, calculators, TV monitors, flat panel displays, computer monitors, car displays (such as odometer display etc.), navigators, cockpit controllers and/or displays, camera view displays (such as rear view camera display in a vehicle), electronic photos, electronic billboards or signages, projectors, building structures, packaging and aesthetic structures (such as a display for an image of a piece of jewelry) etc. In addition, the display device may also be a display panel.

In some embodiments of the present disclosure, the display device 400 includes the above-described display panel 300, and the display panel 300 includes the above-described substrate assembly 200. The substrate assembly 200 in the display panel 300 has the same technical features and advantageous effects as the above-described substrate assembly 200. The technical features and advantageous effects of the substrate assembly 200 have been described in detail above, and will not be described herein again.

The foregoing descriptions are merely specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A substrate assembly comprising a cover plate and a functional substrate which are stacked, wherein
the functional substrate has a functional region and a non-functional region surrounding the functional region, and the non-functional area includes a plurality of first bonding regions;
the cover plate has a primary region and a peripheral region surrounding the primary region; the primary region is a vertical projection of the functional region of the functional substrate on the cover plate; the peripheral region includes a second bonding region and a plurality of third bonding regions; the number of the third bonding regions equals to or is greater than the number of the first bonding regions, and each of the first bonding regions has one of the third bonding regions corresponding thereto;
the functional substrate includes a plurality of first conductive terminals located in each first bonding region;
the cover plate includes a plurality of second conductive terminals located in the second bonding region, and a plurality of third conductive terminals located in each third bonding region;
the plurality of the first conductive terminals in each of the first bonding regions are bonded to the plurality of the third conductive terminals in one corresponding third bonding region through one connector in a one-to-one, many-to-one, or one-to-many manner; and the plurality of the third conductive terminals in each of the third bonding regions are coupled to the plurality of the second conductive terminals in the second bonding region through at least one trace in a one-to-one, many-to-one, or one-to-many manner;

wherein the cover plate further includes a first substrate and a light shielding structure disposed on the first substrate; and the light shielding structure is located in the peripheral region; and each of the second conductive terminals, each of the third conductive terminals and each of the traces are disposed on a side of the light shielding structure facing the first substrate or a side of the light shielding structure away from the first substrate.

2. The substrate assembly according to claim 1, wherein a vertical projection of the functional substrate on the cover plate covers the primary region and does not overlap with the peripheral region.

3. The substrate assembly according to claim 1, wherein the plurality of the first conductive terminals in each of the first bonding regions are bonded to the plurality of the third conductive terminals in one corresponding third bonding region through one connector in the one-to-one manner; or the plurality of the third conductive terminals in each of the third bonding regions are coupled to the plurality of the second conductive terminals in the second bonding region through a plurality of traces in the one-to-one manner.

4. The substrate assembly according to claim 1, wherein the plurality of the first conductive terminals in each of the first bonding regions are bonded to the plurality of the third conductive terminals in one corresponding third bonding region through one connector in the one-to-one manner; and the plurality of the third conductive terminals in each of the third bonding regions are coupled to the plurality of the second conductive terminals in the second bonding region through a plurality of traces in the one-to-one manner.

5. The substrate assembly according to claim 1, wherein each of the first bonding regions and a corresponding third bonding region are located on a same side of the functional region.

6. The substrate assembly according to claim 1, wherein a plurality of connectors do not overlap in the stacking direction of the functional substrate and the cover plate.

7. The substrate assembly according to claim 1, wherein each of the connectors is an FPC, FFC or PCB.

8. The substrate assembly according to claim 1, wherein the second conductive terminals, the third conductive terminals and the traces are made of the same material.

9. The substrate assembly according to claim 1, wherein the second conductive terminals, the third conductive terminals and the traces are produced in the peripheral region of the cover plate by a printing process.

10. The substrate assembly according to claim 1, wherein the light shielding structure is made of black ink or black resin.

11. The substrate assembly according to claim 1, which including an adhesive layer configured to join the functional substrate to the cover plate.

12. The substrate assembly according to claim 11, wherein the adhesive layer is made of optically clear adhesive and/or liquid optically clear adhesive.

13. The substrate assembly according to claim 1, wherein the functional substrate is a display substrate or a touch substrate.

14. The substrate assembly according to claim 13, wherein the functional substrate is a touch substrate;

the touch substrate includes a second substrate, and a plurality of emission electrodes and a plurality of sensing electrodes disposed on the second substrate and located in the functional region; and the plurality of the emission electrodes and the plurality of the sensing electrodes are located in a same layer or in different layers.

15. The substrate assembly according to claim 1, wherein the cover plate further includes a first substrate, and the functional substrate further includes a second substrate; and the first conductive terminals are disposed on a side of the second substrate away from the cover plate, and the third conductive terminals are disposed on a side of the first substrate facing the functional substrate.

16. The substrate assembly according to claim 1, wherein the cover plate further includes a first substrate, and the functional substrate further includes a second substrate; and the first conductive terminals are disposed on a side of the second substrate facing the cover plate, and the third conductive terminals are disposed on a side of the first substrate facing the functional substrate.

17. A display panel comprising:
the substrate assembly of claim 1; and,
an opposite substrate disposed on a side of the functional substrate away from the cover plate.

18. The display panel according to claim 17, wherein
the functional substrate is a touch substrate, and the opposite substrate is a display substrate;
or,
the functional substrate is an array substrate, and the opposite substrate is a color film substrate or a protection substrate.

19. A display device comprising a control board, and the substrate panel of claim 17,
wherein each of the second conductive terminals located in the second bonding region are configured to be coupled to the control board.

* * * * *